United States Patent
Tamal

(10) Patent No.: US 11,495,721 B2
(45) Date of Patent: Nov. 8, 2022

(54) PARABOLIC TROUGH SOLAR GENERATION WITH UNDERGROUND COOLING

(71) Applicant: Imam Abdulrahman Bin Faisal University, Dammam (SA)

(72) Inventor: Mahbubunnabi Tamal, Dammam (SA)

(73) Assignee: Imam Abdulrahman Bin Faisal University, Dammam (SA)

( * ) Notice: Subject to any disclaimer, the term of this patent is extended or adjusted under 35 U.S.C. 154(b) by 0 days.

(21) Appl. No.: 17/731,824

(22) Filed: Apr. 28, 2022

(65) Prior Publication Data

US 2022/0254977 A1 Aug. 11, 2022

Related U.S. Application Data

(60) Continuation of application No. 17/205,115, filed on Mar. 18, 2021, now Pat. No. 11,411,157, which is a
(Continued)

(51) Int. Cl.
*H01L 35/30* (2006.01)
*H01L 35/04* (2006.01)
*H01L 35/32* (2006.01)

(52) U.S. Cl.
CPC .............. *H01L 35/30* (2013.01); *H01L 35/04* (2013.01); *H01L 35/32* (2013.01)

(58) Field of Classification Search
CPC ......... H01L 31/0543; H01L 35/28–325; H01L 35/06; H01L 35/10; H01L 31/052–0525;
(Continued)

(56) References Cited

U.S. PATENT DOCUMENTS 4,441,067 A 4/1984 O'Hare
6,899,097 B1 * 5/2005 Mecham ............... F24S 23/12
126/685
(Continued)

FOREIGN PATENT DOCUMENTS

KR 10-1671455 11/2016
WO 94/01893 1/1994

OTHER PUBLICATIONS

Tang, et al. ; A research on thermoelectric generator's electrical performance under temperature mismatch conditions for automotive waste heat recovery system ; Case Studies in Thermal Engineering vol. 5 ; pp. 143-150 ; Mar. 2015 ; 13 Pages.

*Primary Examiner* — Ryan S Cannon
(74) *Attorney, Agent, or Firm* — Oblon, McClelland, Maier & Neustadt, L.L.P.

(57) ABSTRACT

A system, a thermoelectric generator, and a method for generating electricity are provided. The system includes a thermoelectric generator, a cooling system, and a heating system. The cooling system includes a cold side module configured to hold a predetermined volume of air, a subterranean heat exchanger including an underground conduit, the underground conduit having a first end configured to receive ambient air and a second end coupled to the inlet of the cold side module, and an air exhaust coupled to the outlet of the cold side module and having one or more valves configured to control an airflow from the subterranean heat exchanger towards the air exhaust. The heating system includes a first solar concentrator to collect light rays, a hot side module, and a fiber optic cable to transport the collected light rays to the hot side module.

5 Claims, 7 Drawing Sheets

Related U.S. Application Data division of application No. 16/391,472, filed on Apr. 23, 2019, now Pat. No. 11,043,624.

(58) Field of Classification Search
CPC ........ F24F 5/0042; F24F 5/0046; F24F 5/005; F24S 23/71–80; F24S 23/834; H02S 40/40–44

See application file for complete search history.

(56) References Cited

U.S. PATENT DOCUMENTS

| | | |
|---|---|---|
| 2002/0185168 A1 | 12/2002 | Hunt |
| 2004/0134200 A1 | 7/2004 | Schroeder |
| 2005/0051208 A1 | 3/2005 | Mount |
| 2005/0103615 A1 | 5/2005 | Ritchey |
| 2007/0251569 A1 | 11/2007 | Shan |
| 2008/0128012 A1* | 6/2008 | Schick .................... H01L 35/30 136/200 |
| 2008/0251125 A1 | 10/2008 | Cheng |
| 2009/0301541 A1* | 12/2009 | Watts ..................... F24S 90/00 136/205 |
| 2009/0301687 A1 | 12/2009 | Watts |
| 2010/0025008 A1 | 2/2010 | Walford |
| 2010/0108142 A1 | 5/2010 | Farhadieh |
| 2010/0229854 A1 | 9/2010 | Martin-Lopez |
| 2011/0209744 A1 | 9/2011 | Hu |
| 2012/0227779 A1 | 9/2012 | Miao |
| 2013/0118543 A1 | 5/2013 | Kim |
| 2015/0122309 A1 | 5/2015 | Agraz Huitron |
| 2015/0179910 A1 | 6/2015 | Al Jasem |
| 2020/0185585 A1 | 6/2020 | Piggot |

* cited by examiner

PARABOLIC TROUGH SOLAR GENERATION WITH UNDERGROUND COOLING

CROSS-REFERENCE TO RELATED APPLICATIONS

The present application is a Continuation of U.S. application Ser. No. 17,205,115, now allowed, having a filing date of Mar. 18, 2021 which is a Divisional of U.S. application Ser. No. 16/391,472, now U.S. Pat. No. 11,043,624, having a filing date of Apr. 23, 2019.

BACKGROUND

Field of the Invention

This invention generally relates to a thermoelectric generator system. In particular, the invention provides a thermoelectric generator system based on renewable energy.

Background of the Invention

With ever increasing dependence on fossil fuels, interest in renewable energy generation is increasing. Solar energy is harnessed using a plethora of technologies such as photovoltaic cells, solar thermal heating through parabolic reflectors or concentrators, solar architecture, and artificial photosynthesis. Solar energy is one of the promising techniques of renewable energy generation and it is mainly divided into active and passive techniques depending on the means of capturing and distributing this energy. Active solar energy techniques include semiconductor or organic photovoltaic technologies and solar concentrators. Passive solar techniques include solar architecture (building orientation towards the sun), material selection that have adequate thermal mass or light dispersing properties.

A thermoelectric generator (TEG) is a device that converts thermal energy into electrical energy based on the Seebeck effect and the Peltier effect. The Seebeck effect or principle states that if two wires of different materials are joined at their ends, forming two junctions, and one junction is held at a higher temperature than the other junction, a voltage difference arises between the two junctions. The TEGs have many advantages such as no moving mechanical parts, long lifetime, quiet operation, and environmentally friendliness.

However, it has always been a challenging task to create a heat flux between the two sides of the TEG. Accordingly, what is needed, as recognized by the present inventor, is a method and system that creates the heat flux using renewable energy.

The foregoing "Background" description is for the purpose of generally presenting the context of the disclosure. Work of the inventor, to the extent it is described in this background section, as well as aspects of the description which may not otherwise qualify as prior art at the time of filing, are neither expressly or impliedly admitted as prior art against the present invention.

Accordingly it is one object of the present disclosure to provide a thermoelectric generating system that creates a heat flux for the thermoelectric generator using renewable energy.

SUMMARY

The present disclosure relates to a system for generating electricity. The system includes a thermoelectric generator, a cooling system, and a heating system. The cooling system includes a cold side module configured to hold a predetermined volume of air, a subterranean heat exchanger including an underground conduit, the underground conduit having a first end configured to receive ambient air and a second end coupled to the inlet of the cold side module, and an air exhaust coupled to the outlet of the cold side module and having one or more valves configured to control an airflow from the subterranean heat exchanger towards the air exhaust. The heating system includes a first solar concentrator to collect light rays, a hot side module, and a fiber optic cable to transport the collected light rays to the hot side module.

The present disclosure also relates to a method for generating electricity. The method includes heating a hot side of a thermoelectric generator via concentrated light rays collected using a solar concentrator and transported via a fiber optic cable; cooling a cold side of the thermoelectric generator via a cooling system; and connecting an output of the thermoelectric generator to a transformer to provide AC current. The cooling system includes a cold side module configured to hold a predetermined volume of air, the cold side module having an inlet and an outlet, a subterranean heat exchanger including an underground conduit, the underground conduit having a first end configured to receive ambient air and a second end coupled to the inlet of the cold side module, and an air exhaust coupled to the outlet of the cold side module and having one or more valves configured to control an airflow from the subterranean heat exchanger towards the air exhaust.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
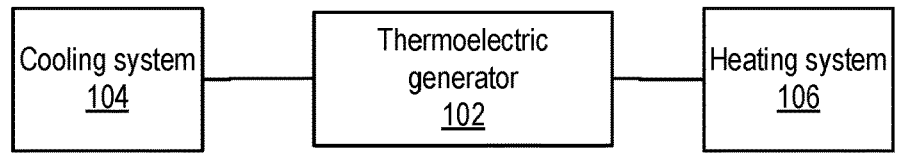
FIG. 1 is a schematic that shows a system for generating power using a thermoelectric generator (TEG) according to one example.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically.

Reference throughout this document to "one embodiment", "certain embodiments", "an embodiment", "an implementation", "an example" or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Referring now to the drawings, wherein like reference numerals designate identical or corresponding parts throughout several views, the following description relates to a system and associated methodology for electrical energy generation via a thermoelectric generator (TEG).

The renewable electricity generation system described herein uses renewable resources to provide a temperature difference to the thermoelectric generator. For example, the system uses natural convection and solar thermal energy collected via fiber optics bundles.

FIG. 1 is a schematic that shows a system 100 for generating power using a thermoelectric generator 102 (i.e., a Seebeck generator) according to one example. The TEG 102 is a solid state device that converts heat flux (i.e., temperature differences) directly into electrical energy through a phenomenon called the Seebeck effect (a form of thermoelectric effect). The generated electrical energy is proportional to the temperature differences.

The thermoelectric generator 102 includes a first thermoelectric layer and a second thermoelectric layer. The first thermoelectric layer is disposed adjacent to the second thermoelectric layer in a substantially parallel spatial relationship. The thermoelectric generator 102 generates electrical energy as a function of a temperature difference between the first thermoelectric layer and the second thermoelectric layer based on the Seebeck effect as described previously herein (also referred to herein as the cold side and hot side of the TEG 102).

The system 100 creates a temperature differential across the TEG 102 via a cooling system 104 and a heating system 106 (e.g., heat exchangers). The cooling system 104 and the heating system 106 supply cooling and heating to the cold side and hot side of the TEG 102, respectively. The cooling system 104 is operatively connected to the cold side of the thermoelectric generator (e.g., the first thermoelectric layer) to cool the cold side. The cold side of the TEG 102 is maintained at a constant temperature in the range of 5 to 10° C. In one implementation, the temperature is maintained using cool air cooled via a subterranean air cooling module as shown and described in FIG. 2. The cooling system 104 may be coupled to multiple TEGs 102. The heating system 106 may also be coupled to the multiple TEGs 102. The TEG 102 may be an array of one or more TEGs 102 arranged in a single layer between the cooling system 104 and the heating system 106. The one or more TEGs 102 may be connected as a group to provide a specified voltage and/or current.

Figure 2:
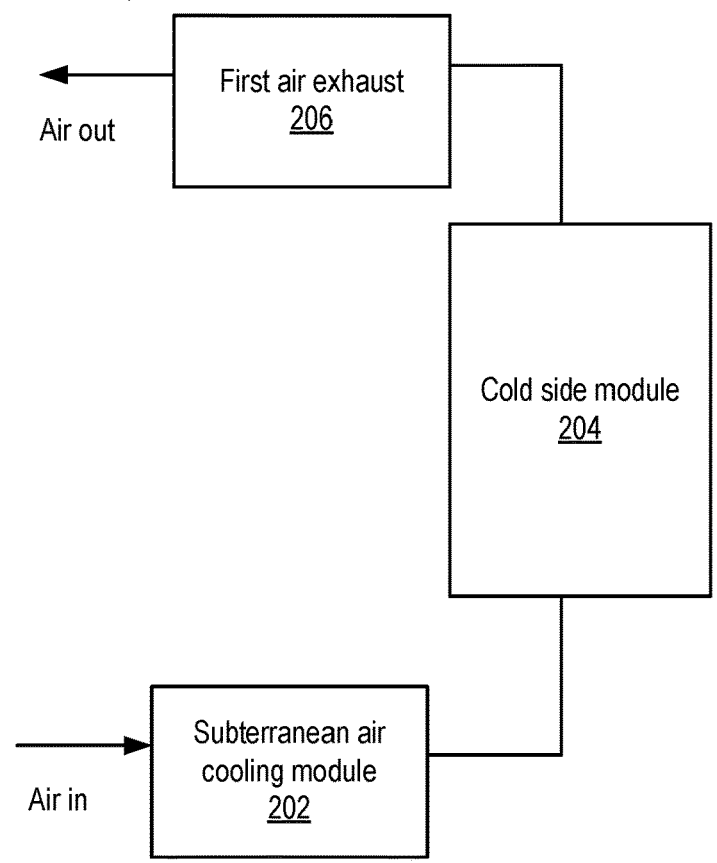
FIG. 2 is a schematic that shows a cold air system according to one example.

FIG. 2 is a schematic that shows the cooling system 104 according to one example. The cooling system 104 includes a subterranean air cooling module 202, a cold side module 204, and a first air exhaust 206. Air at ambient temperature is input to the subterranean air cooling module 202. The air passes through the subterranean air cooling module 202 and reaches a predetermined temperature (e.g., temperature between 5 to 10° C.). The higher temperature at the first air exhaust 206 creates a natural air flow towards the cold side module 204.

The cold side module 204 is disposed adjacent to the first thermoelectric layer (cold side of the TEG 102) and hold a predetermined volume of air. The cold side module 204 maintains the first thermoelectric layer at a cold temperature with respect to the second thermoelectric layer via the flow of cold air from the subterranean cooling module 202 towards the first air exhaust 206. The cold side module 204 includes at least one inlet and one outlet. The inlet is coupled to the subterranean air cooling module via a conduit. The conduit is insulated to minimize heat exchange with ambient air. The cold side module 204 may be coupled to multiple subterranean air cooling modules.

The first air exhaust 206 includes an inlet and an outlet. The inlet is coupled to the outlet of the cold side module 204 via a conduit. The outlet includes one or more valves to control the output of the air. The first air exhaust 206 may be an air tank that holds a predetermined volume of air. The first air exhaust 206 may be heated via light rays or via ambient air to maintain a hotter temperature with respect to the air in the cold side module 204. The first air exhaust may also include a fan to withdraw air from the cold side module 204. Alternatively, the fan may be disposed on a side of the cold side module 204 to withdraw the air.

The cold side module 204 has a rectangular shape. At least one side of the cold side module 204 is in a direct contact with the cold side of the TEG 102. In one implementation, the at least one side of the cold side module 204 has a size and a shape that match the size and the shape of the cold side of the TEG 102.

In one implementation, multiple TEGs 102 are disposed in direct contact with the at least one side of the cold side module 204 to cover the complete surface of the at least one side of the cold side module 204. The cold side module 204 may include insulating materials to minimize heat exchange with the ambient air. For example, one or more layers of insulating materials may be disposed on the side of the cold side module non-adjacent to the first thermoelectric layer (or cold side). In one example, insulating materials are disposed on inside or outside surfaces of the cold side module 204 that are not in direct contact with the cold side of the TEG 102. Insulating materials may also be disposed on the hot side of the TEG 102. Insulating materials may include non-electrically conductive materials that withstand high temperatures. High-temperature examples of insulation include ceramics in both solid and fabric form, as well as other inorganic thermal insulators. Additionally, for lower-temperature operations, various polymers can be used. Suitable examples of such polymers include neoprene and/or silicone rubber. The cold side module 204 may be of size and shape corresponding to the size and shape of the cold side of the thermoelectric generator 102 as described previously herein.

The subterranean air cooling module 202 may include a conduit disposed underground and coupled to the cold side module 204. The subterranean air cooling module 202 may include a fan to induce air to the conduit. The fan may be coupled to a first end (or inlet) of the conduit. As air moves through the underground conduit the earth or ground acts as a heat exchanger to cool the air passing through the conduit. The cooled air is directed from the underground conduit into the cold side module 204 so to cool the cold side of the TEG 102. The underground conduit has a shape/size to maximize heat transfer with the soil or geological formation. For example, the underground conduit includes multiple fins on an outer surface of the underground conduit to enhance heat exchange with the soil. An insulation layer may be disposed on outer surfaces of the conduit that are above ground level. Insulation layers may be around the entire length of the underground conduit. The layers may include a moisture retaining layer (e.g., a layer of sand disposed in between two other insulation materials). The moisture retaining layer helps increase the efficiency of heat exchange with the underground conduit. The layers type and thickness are selected based on the characteristics of the ground at the location of the system 100.

In one implementation, the subterranean air cooling module includes 202 a metal pipe located 5 to 5 feet beneath the ground where the temperature is approximately constant at 5 to 10° C. (constant temperature depth zone). The location of the metal pipe beneath the ground may be based on the characteristics of the ground at the location of the system 100 (i.e., based on the type of soil). Further, the length and shape of the metal pipe may be based on the characteristics of the ground and desired temperature of air.

The underground conduit may include multiple sections of different diameters. For example, a first section of the underground conduit includes a vertical stretch from the inlet to a predetermined depth associated with the constant temperature depth zone. A second section includes a horizontal stretch at the predetermined depth. A third section includes a vertical stretch from the predetermined depth to the inlet of the cold side module 204. The first section and the third section may be substantially straight stretches. The second section may have a serpentine shape (in the horizontal plane). An end of the first section is coupled to a first end of the second section via a first elbow. A second end of the second section is coupled to an end of the third section via a second elbow.

In one implementation, the second section includes two or more parallel stretches. The stretches are coupled together at the first elbow and the second elbow. A diameter of the conduit at the second section may be larger than the diameter of conduit in the first section. The diameter of the conduit in the third section is equal to the diameter of the conduit in the first section. The first elbow and the second elbow are 90 degree elbows. A first end of the first elbow has a diameter corresponding to the diameter of the conduit in the first section and a second of the first elbow has a diameter corresponding to the diameter of the conduit in the second section. The change in diameter provides greater control on the flow of air in the subterranean air cooling module 202.

Figure 3:
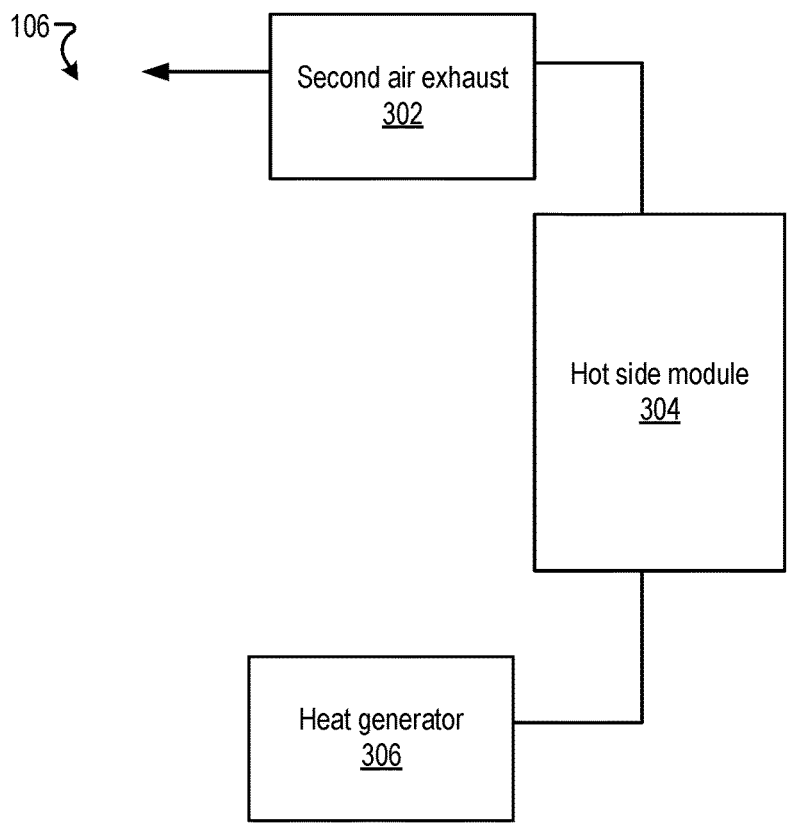
FIG. 3 is a schematic that shows a heating system according to one example.

FIG. 3 is a schematic that shows the heating system 106 according to one example. The heating system 106 includes a heat generator 306, a second air exhaust 302, and a hot side module 304. The heat generator 306 may include a solar thermal concentrator or a black body system to concentrate solar radiation to generate heat for the hot side of the TEG 102 as discussed further below. The hot side module 304 maintains the second thermoelectric layer at a higher temperature relative to the first thermoelectric layer. The hot side module 304 may include insulating materials disposed on the side non-adjacent to the second thermoelectric layer to minimize the loss of heat due to the ambient temperature (e.g., heat exchange with the ambient air). In one example, the hot side module 304 may be in a direct contact with the hot side of the TEG 102. In another example, a material may be deposited between the hot side module 304 and the hot side of the TEG 102 such as a heat retaining material.

The heat generator 306 may include one or more fans to circulate the heated air towards the hot side module 304. In one implementation, natural convection heat transfer mechanism is used to transfer heat using air flow.

Air and/or fiber optics bundles (FOB) are used to carry heat or concentrated solar light rays to the hot side of the TEG 102. The temperature of the generated heat depends on weather conditions, time of the year, time of the day, and the like. The hot side module 304 includes insulating materials and heat retaining materials as discussed previously herein. The hot side module 304 may be of a size and shape corresponding to the hot side of the TEG 102. The heat generator 306 may provide heat to multiple TEGs 102.

Figure 4:
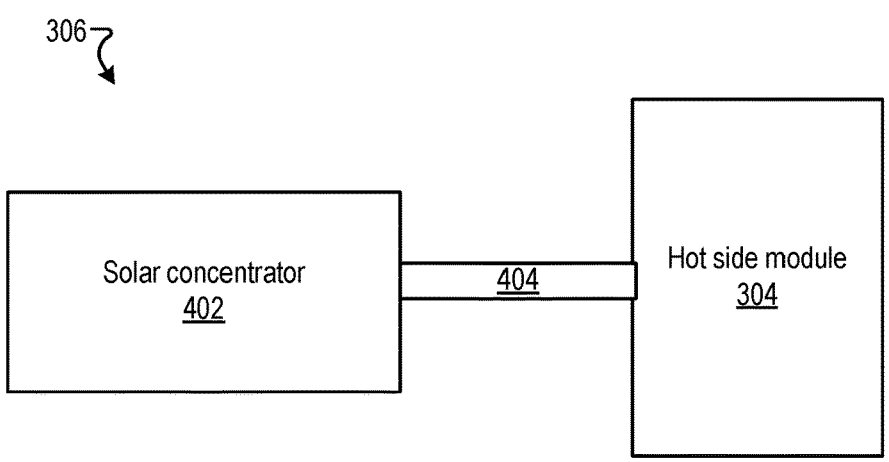
FIG. 4 is a schematic that shows a heat generator according to one example.

FIG. 4 is a schematic that shows the heat generator 306 according to one example. The heat generator 306 includes a solar concentrator 402 and an optical fiber bundle 404. The solar concentrator 402 may include one or more optical elements (e.g., lenses, mirrors) configured to focus incident light rays from the sun to an entry of an optical fiber and/or a bundle of optical fibers. The optical fiber bundle 404 carries the concentrated light to the hot side module 304. The fiber optics may be composed of plastic fiber optics (e.g., Polymethyl methacrylate (PMMA) and fluorinated polymers). In one implementation, the fiber optics may carry to one or more thermoelectric generators as discussed further below. The solar concentrator 402 may include a Fresnel lens which focuses light and infrared radiation from the sun onto a solar radiation collector or a collector plate of the solar concentrator 402. The solar concentrator 402 may be rotatable in order to maximize power generation. For example, the solar concentrator 402 may be oriented with the sun to maintain proper focus.

In one implementation, the solar concentrator 402 is a Fresnel lens. The fiber optic bundle terminates to provide a surface that coincides with the focal point of the Fresnel lens. The fiber optic bundle can be cut so it has an angled terminus (a terminus that ends in a 45° angle) and the Fresnel lens is focused on the exposed ends of the cable.

In one implementation, the fiber optic bundle is mounted on a stage to maximize the coupling efficiency of the focused lights from the Fresnel lens. The fiber optic bundle may couple light from the ultraviolet (UV) and infrared (IR) spectra to maximize the heating.

The concentrated light rays heat the air in the hot side module 304. In one implementation, the concentrated light rays may heat directly the second thermoelectric layer and/or the hot side module 304 as shown in FIG. 5.

Figure 5:
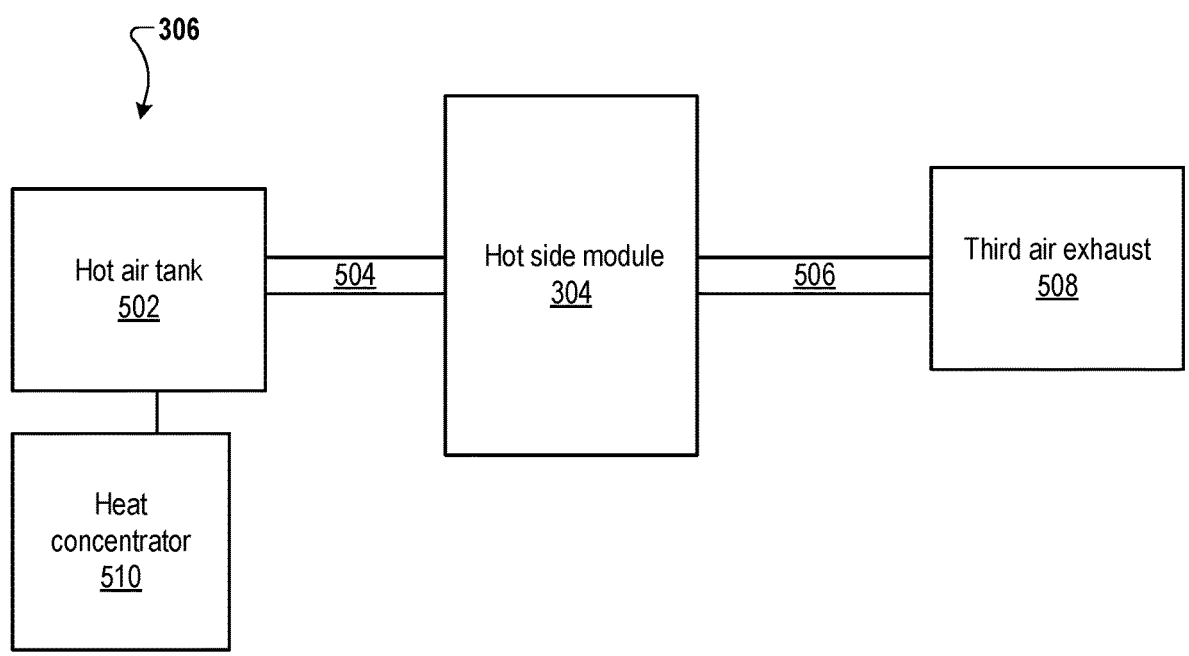
FIG. 5 is a schematic that shows a heat generator according to another example.

FIG. 5 is a schematic that shows the heat generator 306 according to another example. The heat generator 306 includes a heat concentrator 510, a hot air tank 502, and a third air exhaust 508. The hot air tank 502 is coupled to the hot side module 304 via a first air conduit 504. The hot side module 304 is coupled to the third air exhaust 508 via a second air conduit 506.

The heat concentrator 510 may include a solar concentrator that focus light and infrared radiation on the hot air tank 502 to heat the air. The solar concentrator includes two or more solar concentrators that focus light on multiple locations of the hot air tank 502. Each of the solar concentrators may include multiple parabolic units configured to focus light on one location of the multiple locations. The two or more solar concentrators are mounted on a controlled stage to track the sun to maximize efficiency.

In addition or alternatively, air may be heated in an insulated conduit using the heat concentrator 510. The insulated conduit may be positioned along the focal location (e.g., focal axis) of each parabolic unit of the solar concentrator. In other words, multiple heat concentrators are positioned so as the insulated conduit is in the direct path of the reflected solar light rays. A first end of the insulated conduit is coupled to the hot side module 304. A second end of the insulated conduit is coupled to the hot air tank 502. Thus, air in the insulated conduit get heated and flow towards the hot side module 304.

In one example, the hot side module 304 and the cold side module 204 may include compressed air to facilitate heat exchange. The subterranean air cooling module 202 may receive compressed air from an air compressor or a compressed air storage tank. Further, the hot air tank 502 may be filled with compressed air. The third exhaust 508 may be coupled to the hot air tank 502 to recycle air in the system.

Figure 6:
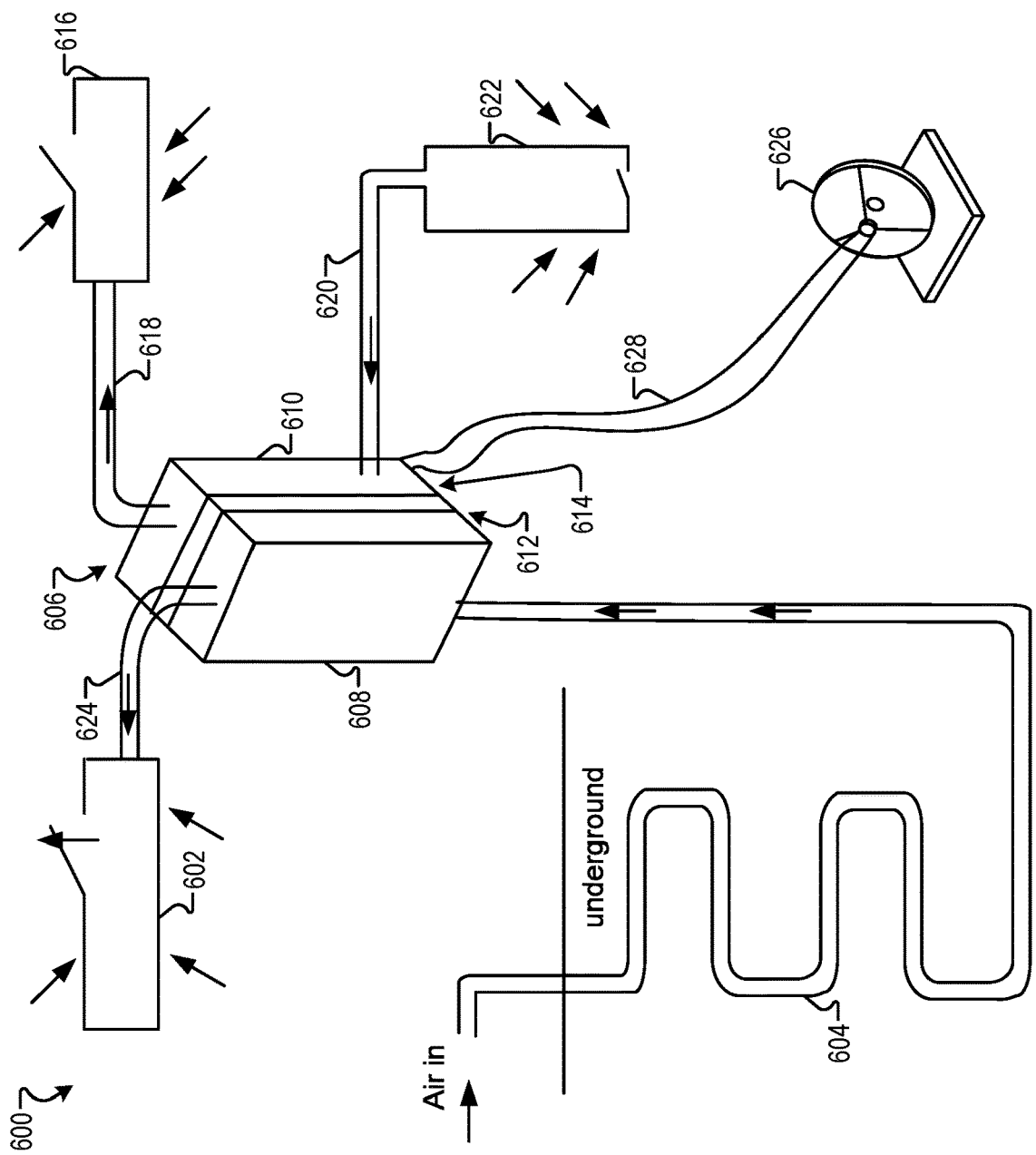
FIG. 6 is a schematic that shows an illustration of the system according to one example.

FIG. 6 is a schematic 600 that shows an illustration of the system according to one example. The TEG 606 includes a cold side 612 and a hot side 614. A cold side module 608 is disposed in a parallel fashion with respect to the cold side 612. The cold side module 608 may be in a direct contact with the TEG 606. A hot side module 610 is disposed in a parallel fashion with respect to the hot side 614 of the TEG 606. The hot side module 610 may be in a direct contact with the TEG 606. Hot air to the hot side module 610 is heated using solar energy. The light rays are directed to the hot side module 610 using fiber optics 628 from a solar concentrator 626. In addition, solar energy is used to heat a hot air tank 622. The hot air tank 622 has an input to receive air at ambient temperature. The air is heated in the hot air tank 622 and directed to the hot side module 610 via conduit 620. The hot side module 610 is connected to a third air exhaust 616 via conduit 618. The concentration of air at the third air exhaust 616 creates a natural flow from the hot air tank 622 towards the hot side module 610 then towards the third air exhaust 616.

The cold side module 608 is coupled to a first air exhaust 602 via conduit 624. Cold air is provided to the cold side module 608 via an underground conduit 604. Air at ambient temperature is cooled when passed through the underground conduit 604. The first air exhaust 602 may be heated by solar energy to create a natural air flow from the underground conduit 604 towards the first air exhaust 602.

Figure 7:
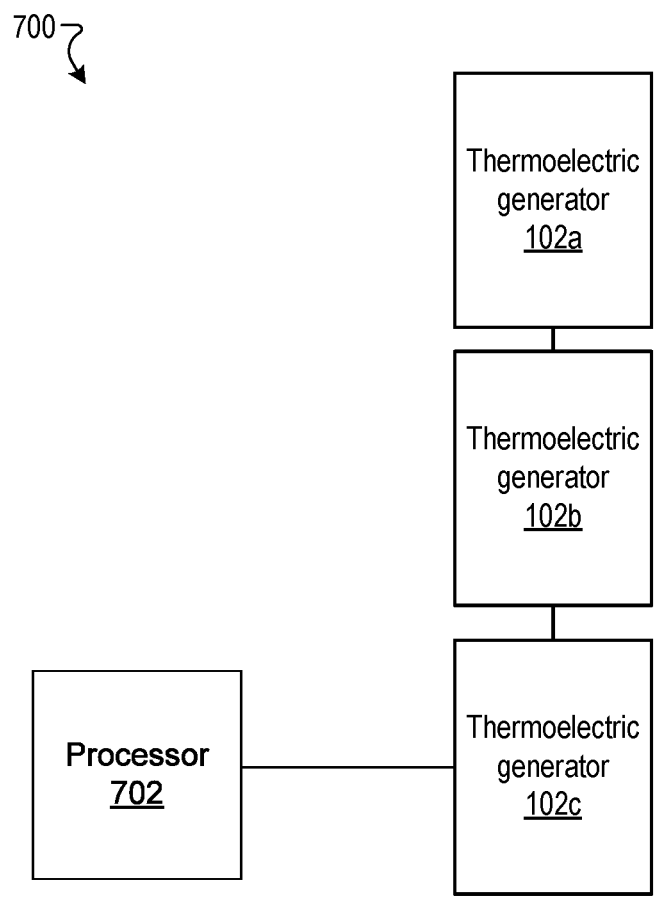
FIG. 7 is a schematic that shows a system including a plurality of thermoelectric generators according to one example.

FIG. 7 is a schematic that shows a system 700 for generating energy from a plurality of thermoelectric generators according to one example. In one implementation, the system 700 may include a first thermoelectric generator 102a, a second thermoelectric generator 102b, and a third thermoelectric generator 102c. The system 700 may include a processor 702 to control the operation of each of the first thermoelectric generator 102a, the second thermoelectric generator 102b, and the third thermoelectric generator 102c. The TEGs may be arranged in a vertical fashion to minimize ground space usage. The processor 702 may control one or more systems of the solar concentrator 402 associated with each of the first thermoelectric generator 102a, the second thermoelectric generator 102b, and the third thermoelectric generator 102c. For example, the processor 702 may control the stage associated with each of the solar concentrator 402 to follow the sun to maximize efficiency.

In one implementation, a solar concentrator may be coupled to two or more thermoelectric generator system. For example, the fiber optics may carry light rays to the first thermoelectric generator 102a, the second thermoelectric generator 102b, and the third thermoelectric generator 102c from a single solar concentrator. A first end of the fiber optics is coupled to the concentrator and a second end is coupled to a fiber optic splitter. For example, a 1×3 equal ratio splitter may be used to divide the concentrated solar light rays into 3 beams, each representing ⅓ of the concentrated solar light rays. Each beam is coupled to hot side modules associated with each of the first thermoelectric generator 102a, the second thermoelectric generator 102b, and the third thermoelectric generator 102c. A non-equal ratio splitter may be used to direct a larger portion of the concentrated solar light rays towards one of the thermoelectric generators. For example, 50% of the concentrated light rays are directed to a first hot side module, 25% of the concentrated light rays are directed to a second hot side module, and 25% are directed to a third hot side module when the predetermined volume of air associated with the first hot side module is greater than the predetermined volume of air held in the second and the third hot side module.

Figure 8:
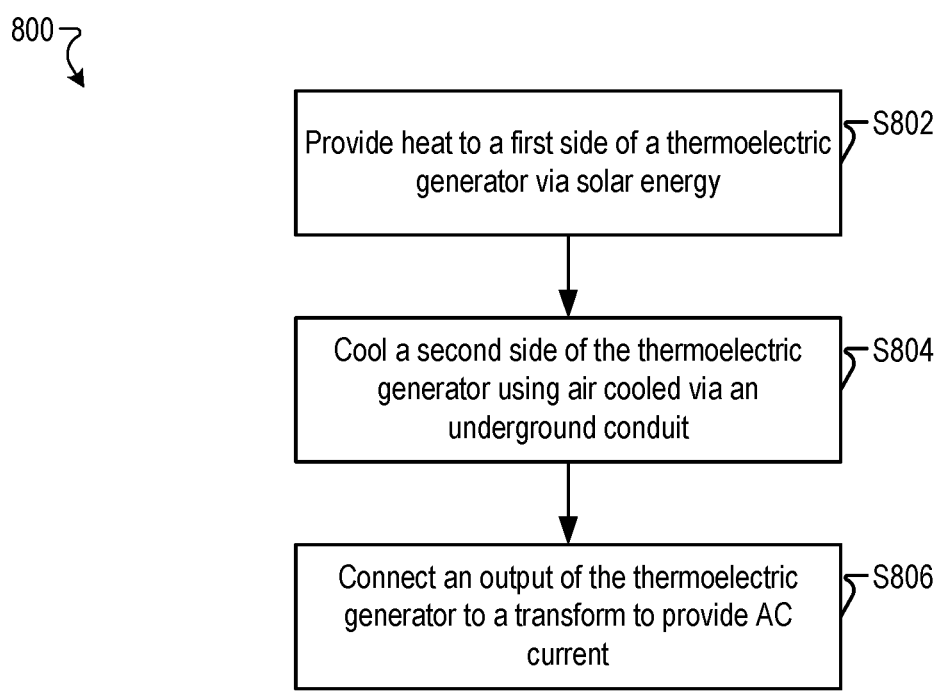
FIG. 8 is a flowchart for a method for generating power using the thermoelectric generator according to one example.

FIG. 8 is a flowchart for a method 800 for generating power using the thermoelectric generator according to one example. At step S802, a hot side of a thermoelectric generator is heated via concentrated rays of the sun.

At step S804, a cold side of the thermoelectric generator is cooled via air cooled via an underground conduit. The underground conduit is positioned at a predetermined distance beneath ground.

At step S806, an output of the thermoelectric generator is connected to a transformer to provide a voltage based on the user requirements.

Figure 9:
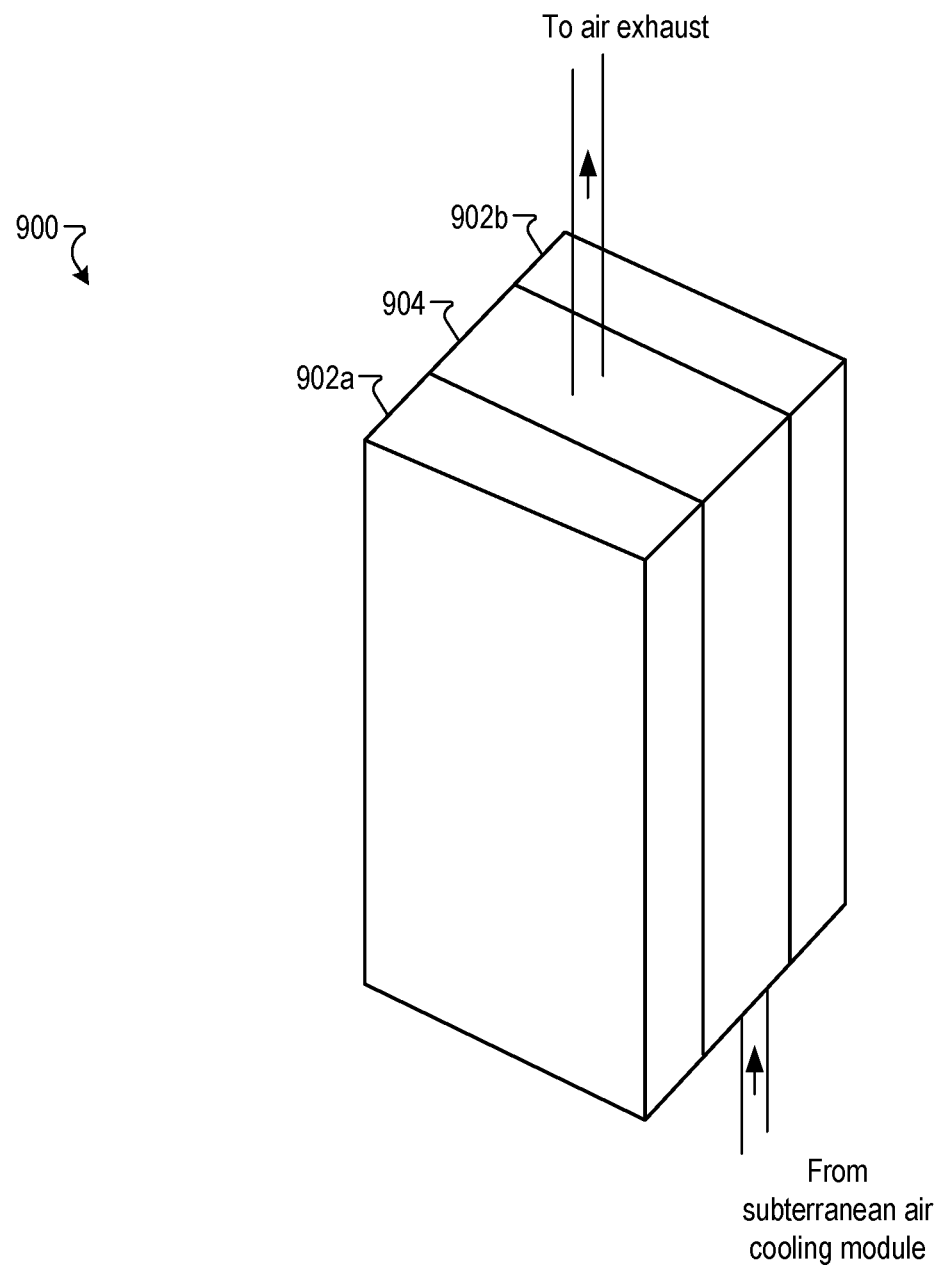
FIG. 9 is a schematic that shows a system for generating energy from a plurality of thermoelectric generators according to one example.

FIG. 9 is a schematic that shows a system 900 for generating energy from a plurality of thermoelectric generators according to one example. The cold side module may provide cooling for two or more TEGs 102. For example, a first side of the cold side module 904 is in direct contact with a cold side of a first TEG 902a and a second side of the cold side module 904 is in direct contact with the cold side of a second TEG 902b. In addition, as discussed previously herein, the first side of the cold side module 904 may provide cooling to multiple TEGs. In one implementation, an entire outer surface of the cold side module is in contact with cold sides of multiple TEGs. In one implementation, 25 TEGs may be arranged in a single 5×5 matrix between the cold side module 204 and the hot side module 304.

A system which includes the features in the foregoing description provides numerous advantages to users. In particular, the system is practical, relatively inexpensive, durable, and easy to maintain. The system described herein provides electricity for long period. The system described herein has low noise generation and does not include moving parts.

Obviously, numerous modifications and variations are possible in light of the above teachings. It is therefore to be understood that within the scope of the appended claims, the invention may be practiced otherwise than as specifically described herein.

Thus, the foregoing discussion discloses and describes merely exemplary embodiments of the present invention. As will be understood by those skilled in the art, the present invention may be embodied in other specific forms without departing from the spirit or essential characteristics thereof.

Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A method for solar generation of a thermoelectric power output, comprising:
   positioning an air conduit underground to form an underground conduit,
   heating a hot side of a thermoelectric generator having a cold side and the hot side via concentrated light rays collected from a heating system having a solar concentrator and transported via a fiber optic cable from the solar concentrator to the thermoelectric generator;
      wherein the solar concentrator includes a plurality of parabolic reflectors oriented to reflect solar energy onto the fiber optic cable;
   cooling the cold side of the thermoelectric generator via a cooling system; and
   generating a current from the thermoelectric generator based on a temperature differential between the cold side and the hot side of the thermoelectric generator;
   passing the current to a transformer to provide an AC current,
   wherein the cooling system includes:
      a cold side module configured to hold a predetermined volume of air, the cold side module having an inlet and an outlet, a subterranean heat exchanger including the underground conduit, the underground conduit having a first end configured to receive ambient air and a second end coupled to the inlet of the cold side module, and an air exhaust coupled to the outlet of the cold side module and having one or more valves configured to control an airflow from the subterranean heat exchanger towards the air exhaust,
   wherein the heating system includes:
      a hot side module having a first rectangular cuboid shape defining a first enclosed space, wherein one side of the first rectangular cuboid shape is defined by the hot side surface of the thermoelectric generator, wherein the hot side module has a hot side air inlet located at a bottom side of the first rectangular cuboid shape and a hot side air outlet located at a top side of the first rectangular cuboid shape.

2. The method of claim 1, wherein the ambient air has a temperature in a range of 5 to 10° C.

3. The method of claim 1, wherein the cold side module has a rectangular second cuboid shape defining a second enclosed space configured to hold the predetermined volume of air, wherein the cold side inlet is located at a bottom side of the second rectangular cuboid shape and the cold side outlet is located at a top side of the second rectangular cuboid shape.

4. The method of claim 1, wherein the underground conduit of the subterranean heat exchanger is a pipe having a plurality of fins.

5. The method of claim 1, wherein the fiber optic cable has a collection end and a transport end, and the collection end has a collection surface angled at 45°.

* * * * *